US008648669B1

(12) United States Patent
Podell

(10) Patent No.: US 8,648,669 B1

(45) Date of Patent: Feb. 11, 2014

(54) PLANAR TRANSMISSION-LINE INTERCONNECTION AND TRANSITION STRUCTURES

(75) Inventor: Allen F. Podell, Palo Alto, CA (US)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 13/586,714

(22) Filed: Aug. 15, 2012

(51) Int. Cl.
*H03H 7/38* (2006.01)
*H01P 5/12* (2006.01)

(52) U.S. Cl.
USPC .............. 333/125; 333/134; 333/136; 333/26

(58) Field of Classification Search
USPC .............. 333/125–129, 132, 134, 136, 25, 26
See application file for complete search history.

(56) References Cited

U.S. PATENT DOCUMENTS

| | | | | |
|---|---|---|---|---|
| 3,239,781 A | | 3/1966 | Podell | |
| 3,311,850 A | | 3/1967 | Podell | |
| 3,325,587 A | | 6/1967 | Sontheimer | |
| 3,327,220 A | | 6/1967 | Podell | |
| 3,399,340 A | | 8/1968 | Podell | |
| 3,508,171 A | | 4/1970 | Podell | |
| 4,647,868 A | * | 3/1987 | Mueller | 330/286 |
| 4,774,481 A | * | 9/1988 | Edwards et al. | 333/127 |
| 4,916,410 A | * | 4/1990 | Littlefield | 330/295 |
| 5,121,090 A | * | 6/1992 | Garuts et al. | 333/124 |
| 5,285,175 A | * | 2/1994 | Edwards | 333/109 |
| 5,461,349 A | * | 10/1995 | Simons | 333/109 |
| 5,745,017 A | * | 4/1998 | Ralph | 333/116 |
| 5,982,252 A | | 11/1999 | Werlau | |
| 6,246,299 B1 | | 6/2001 | Werlau | |
| 6,407,648 B1 | | 6/2002 | Johnson | |
| 6,486,749 B1 | * | 11/2002 | Tichauer et al. | 333/125 |
| 6,750,752 B2 | | 6/2004 | Werlau | |
| 7,692,512 B2 | | 4/2010 | Podell | |
| 2011/0074519 A1 | | 3/2011 | Podell | |

OTHER PUBLICATIONS

U.S. Appl. No. 13/586,649 filing date Aug. 30, 2012; inventor Allen F. Podell title Combiner/Divider with Coupled Transmission Line.
U.S. Appl. No. 13/586,684; filing date Aug. 15, 2012; inventor Allen F. Podell title Combiner/Divider with Interconnection Structure.

* cited by examiner

*Primary Examiner* — Robert Pascal
*Assistant Examiner* — Kimberly Glenn
(74) *Attorney, Agent, or Firm* — Kolisch Hartwell, PC

(57) ABSTRACT

A combiner/divider circuit may include a plurality of planar transmission lines that each may have a planar signal conductor and at least a planar signal-return conductor. Ends of different ones of the signal conductors of the plurality of transmission lines may interconnect with the signal conductor of a first transmission line may be connected to the signal conductors of second and third transmission lines. Signal-return conductors of the first, fourth, and fifth transmission lines may be connected along their lengths. Vias may connect signal-return conductors of the second and third transmission lines with respective signal conductors of the fourth and fifth transmission lines. The positions of the fourth and fifth strip-lines relative to the first strip line may reverse in a transition region spaced from the connection region.

20 Claims, 6 Drawing Sheets

PLANAR TRANSMISSION-LINE INTERCONNECTION AND TRANSITION STRUCTURES

BACKGROUND

This application is directed to transmission line circuit structures, such as may be used for combiner/divider circuits, baluns, and the like, and particularly to planar circuit structures. High power broadband communication systems require high power broadband antennas. Often these antennas have an input impedance that does not match the desired transmitter or receiver with which it is used. In such circumstances, baluns can be used to transform the impedance of the antenna to the impedance of the transmitter or receiver, or to convert between an unbalanced signal and a balanced signal. When large bandwidths are desired, coaxial baluns are often used.

Simple signal sources have two terminals, a source terminal and a return terminal, where most commonly a ground plane is used for the return path. The ground plane return simplifies circuit wiring, as a single conductor and the ground plane form a complete signal path. The voltage on the ground plane is then the reference for this signal. Often this is referred to as an "unbalanced circuit," or "single ended circuit." In such unbalanced circuits, when wires cross or run parallel with one another, there can be undesired coupling.

One method for reducing such coupling is to use two conductors, one for the signal, the other for the signal return path, eliminating the ground plane return path. This is referred to as a "balanced" or "differential" circuit. In AC signals, either conductor can be considered to be the signal, and the other the signal-return. To minimize coupling to other circuits, it is highly desired that the signal current flowing in the two conductors be exactly the same, and 180 degrees out of phase. That is, all of the return current for one conductor of the pair is carried by the other conductor, and the circuit is balanced. This results in zero current being carried by the ground plane. In practice, such perfectly balanced currents are only a theoretical goal.

An amplifier that uses balanced or differential input and output connections is less likely to have oscillations caused by coupling of the input and output signals, and will have less extraneous noise introduced by the surrounding circuitry. For this reason, practically all high gain operational amplifiers are differential. A "balun" (short for "balanced-unbalanced") is a component that converts between an unbalanced source and a balanced one. Some baluns are constructed with nearly complete isolation between the balanced terminals and ground. Some baluns are constructed with each balanced terminal referenced to ground, but with equal and opposite voltages appearing at these terminals. These are both valid baluns, but in the first case, the unbalanced voltage encounters high impedance to ground, making unbalanced current flow difficult, while in the second, any unbalanced current encounters a short circuit to ground, minimizing the voltage that enters the balanced circuit.

Microwave baluns can be either of these types, or even a mixture of the two. In any case, one could connect two equal unbalanced loads to the two balanced terminals, with their ground terminals connected together to ground. Ideally, the unbalanced signal input to the balun would be equally distributed to the two unbalanced loads. Thus, a balun may accordingly be used as a power divider or combiner, such as in a hybrid circuit, where the two unbalanced loads or sources connected to the balanced terminals are operating 180 degrees out of phase.

SUMMARY

One example of a combiner/divider circuit may include a plurality of planar transmission lines. Each transmission line may have a planar signal conductor and at least a planar first signal-return conductor disposed in spaced opposition to the respective signal conductor of the same transmission line. The first signal-return conductors of the plurality of planar transmission lines may also be coplanar in a connection region. The connection end of the signal conductor of the first transmission line may be connected to the connection ends of the signal conductors of second and third transmission lines. A first via may connect the first signal-return conductor of the fourth transmission line with the first signal conductor of the second transmission line. A second via may connect the connection end of the first signal-return conductor of the fifth transmission line with the connection end of the first signal conductor of the second transmission line.

An example of a planar transmission line structure may include first, second, and third striplines extending through a transition region, with each stripline including opposing planar first and second signal-return conductors and a planar signal conductor disposed between the first and second signal-return conductors. The first stripline may be disposed between the second and third striplines, the positions of the second and third striplines relative to the first strip line reversing in the transition region. The second stripline may include a first transition signal conductor portion that extends in the transition region from a first side of the signal conductor of the first stripline across the signal conductor of the first stripline to a second side of the signal conductor of the first stripline. The third stripline may include a second transition signal conductor portion that extends in the transition region from the second side of the signal conductor of the first stripline across the signal conductor of the first stripline to the first side of the signal conductor of the first stripline.

DETAILED DESCRIPTION

Figure 1:
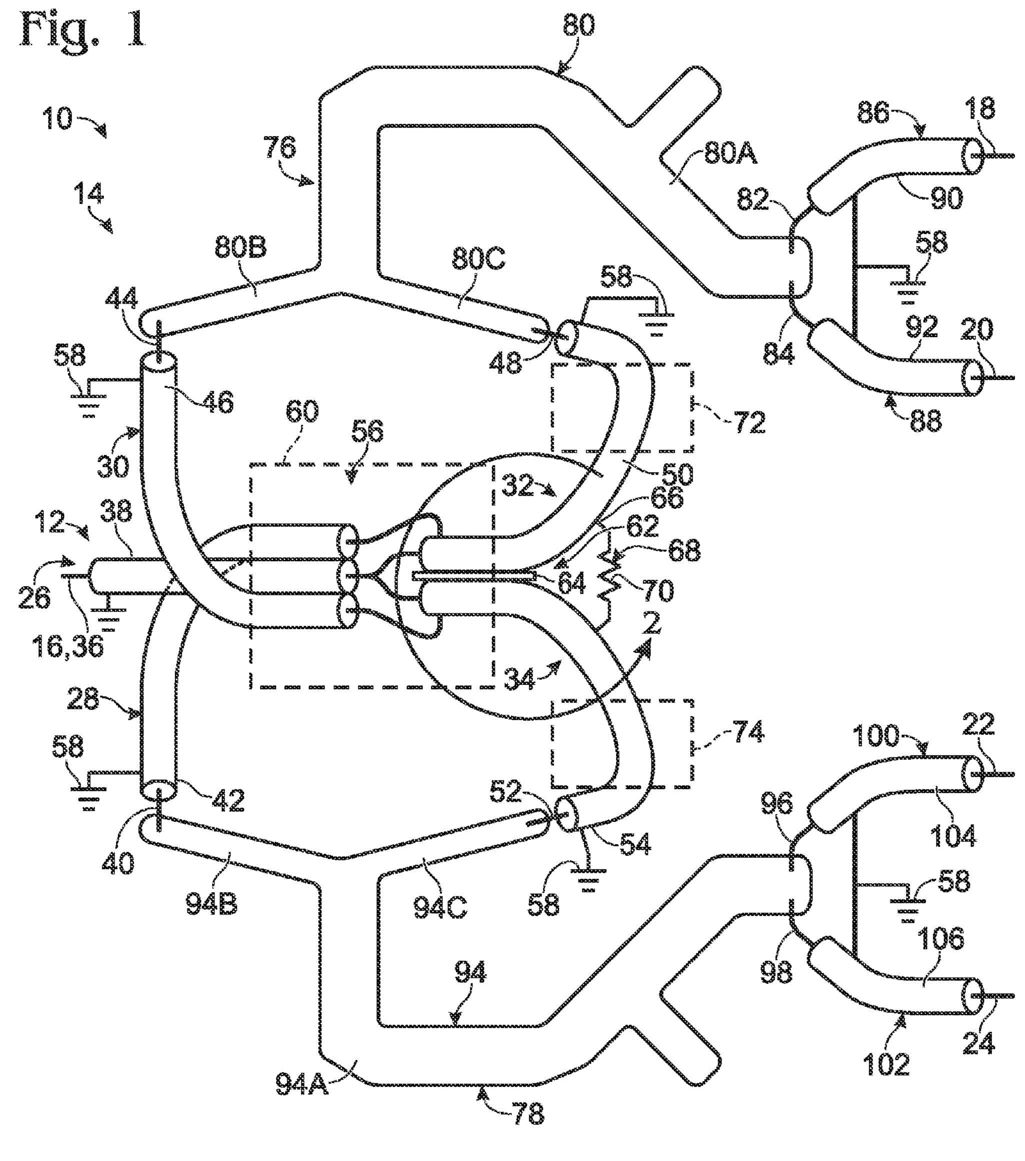
FIG. 1 is a circuit schematic of an example of a 4-way combiner/divider circuit.

Referring now to FIG. 1, an example of a combiner/divider circuit 10 is illustrated. Combiner/divider circuit 10 may include a balun 12 coupled to a signal combining/dividing assembly 14 for transmitting a signal between a combined-signal port 16 and a plurality of component-signal ports 18, 20, 22, and 24. Each port may be a place where characteristics of combiner/divider 10 may be defined, whether accessible or not. A combiner/divider circuit may variously be referred to as a combiner/divider, divider/combiner, divider, or combiner, it being understood that signals and power may be conducted either direction through the circuit to either combine multiple inputs into a single output or to divide a single input into multiple outputs.

Balun 12 may be formed of a transmission line 26. Combining/dividing assembly 14 may include transmission lines 28, 30, 32, 34. Transmission lines 28, 30, 32, 34 may have differing lengths depending on the intended phase relationships desired at the component-signal ports. In some examples, transmission lines 28, 30, 32, 34 may have equal lengths. These transmission lines may be of different forms as is well known in the art, such as coaxial transmission lines, twisted pair, or planar strip lines, such as coplanar waveguides, slot lines, or microstrip lines, or a combination of such transmission lines. Coaxial transmission lines are illustrated in the example shown in FIGS. 1 and 2.

Each transmission line includes at least a pair of electrically spaced-apart inductively coupled conductors that conduct or transmit a signal defined by the voltage differences between the at least a pair of conductors. One conductor is referred to herein as a signal conductor and the other conductor is referred to herein as a signal return conductor. In some types of transmission lines a signal-return conductor may be a shield conductor, as in a coaxial transmission line or a strip line, and a signal return conductor may be in the form of a ground conductor, whether or not it is connected to a local ground, a circuit ground, a system ground, or an earth ground.

As mentioned, in this example, the transmission lines are coaxial transmission lines each having a center conductor, also referred to as a signal conductor, and a shield conductor, also referred to as a shielding conductor or a signal-return conductor. More specifically, transmission line 26 may have a signal or center conductor 36 and a signal-return or shield conductor 38. Similarly, transmission line 28 may have a signal or center conductor 40 and a signal-return or shield conductor 42. Transmission line 30 may have a signal or center conductor 44 and a signal-return or shield conductor 46. Transmission line 32 may have a signal or center conductor 48 and a signal-return or shield conductor 50. Transmission line 34 may have a signal or center conductor 52 and a signal-return or shield conductor 54.

Transmission lines 28, 30, 32, 34 have ends interconnected in a connection region 56. To provide a frame of reference, the ends of the transmission lines that are interconnected in the connection region are referred to as connected or first ends, and the ends that are associated with the identified ports are referred to as the other or second ends. The first end of center conductor 36 of coaxial transmission line 26 is connected to the first ends of the center conductors 48, 52 of coaxial transmission lines 32, 34. The first ends of center conductors 40, 44 of coaxial transmission lines 28, 30 are connected, respectively, to the first ends of shield conductors 50, 54 of coaxial transmission lines 32, 34, as shown.

The second end of shield conductor 38 of coaxial transmission line 26 is grounded to a circuit ground 58 at the second end associated with port 16. The second ends of shield conductors 42, 46, 50, 54 are also respectively connected to circuit ground 58 in this example.

The outer shields of the first ends of coaxial transmission lines 26, 28, 30 are connected and extend through a ferrite sleeve 60. In this example, ferrite sleeve 60 also extends over connection region 56 and the interconnections of transmission lines 26, 28, 30, 32, and 34. In some examples, the ferrite sleeve or loop may not completely surround the transmission line, such as when used for planar transmission line structures. Additionally, ferrite sleeve 60 may be made as a single loop or as an assembly of two or more loops that may be contiguous or spaced apart. Such a ferrite sleeve may be used to choke signals on the shield conductors relative to circuit ground, giving combiner/divider 10 higher bandwidth and reduced losses, thereby permitting higher power applications.

Shield conductors 50 and 54 are inductively coupled along at least portions of the lengths of transmission lines 32 and 34, thereby forming a sixth transmission line 62. As components of transmission line 62, one of conductors 50 and 54 may be referred to as a signal conductor and the other as a signal-return conductor. The spacing and coupling between these shield conductors may be defined by a suitable dielectric element 64 positioned between them. Transmission line 62 conducts any difference in voltage between shield conductors 50 and 54. The end of the transmission line distal of the end in connection region 56 may form a difference-signal port 66. An impedance 68 may terminate the distal end of the transmission line. For instance, a resistor 70 may extend between shield conductors 50 and 54 at port 66 to terminate any difference signal that exists. In this example, there is no circuit ground at this point, which allows the voltages on the two shield conductors to float.

As illustrated, ferrite sleeve 60 may extend along and surround at least a portion of transmission line 62. Additional, second and third ferrite loops 72, 74 may each extend around a respective portion of coaxial transmission lines 32, 34 intermediate port 66 and the second ends of these transmission lines.

The second ends of transmission lines 28, 30, 32, and 34 may form separate ports or may be connected together to form shared ports. In this example, transmission lines 30 and 32 are shown connected to respective portions of a microstrip line 76, and second ends of transmission lines 28, 34 are shown connected to a microstrip line 78. Microstrip line 76 may include a signal conductor 80 including a main section 80A and branch sections 80B and 80C. In this example, the impedances of the branch sections are twice that of the main section of the microstrip line.

The second end of center conductor 44 of coaxial transmission line 30 is connected to an end of branch section 80B, and the second end of shield conductor 46 is connected to circuit ground 58. The signal-return line of microstrip line 80 is represented by the circuit ground. Similarly, the second end of center conductor 48 of coaxial transmission line 32 is connected to an end of branch section 80C, and the second end of shield conductor 50 is connected to circuit ground 58 and thereby to the signal-return line of microstrip line 76. With the second ends of the shield conductors 46, 50 each connected to circuit ground the resulting signal at the second ends of transmission lines 30 and 32 is unbalanced relative to circuit ground.

The end of the main section of the signal conductor of microstrip line 76 is connected to center conductors 82 and 84 of respective terminal coaxial transmission lines 86 and 88. Respective ends of shield conductors 90, 92 of these terminal coaxial transmission lines proximate to the terminal end of microstrip conductor 80 are connected to circuit ground 58, and thereby to the microstrip signal-return line. The other ends of the center conductors of the terminal coaxial transmission lines form respective component ports 18 and 20.

As with microstrip line 76, microstrip line 78 includes a signal conductor 94 including a main section 94A and branch sections 94B and 94C. The second end of center conductor 40 of coaxial transmission line 28 is connected to an end of branch section 94B, and the second end of shield conductor 42 is connected to circuit ground 58 and thereby to the signal-return line of microstrip line 78. Similarly, the second end of center conductor 52 of coaxial transmission line 34 is connected to the end of branch section 94C. The second end of shield conductor 54 is connected to circuit ground 58 and the signal-return line of microstrip line 78.

The end of main section 94A of signal conductor 94 of microstrip line 78 is connected to center conductors 96, 98 of respective terminal coaxial transmission lines 100, 102. Respective ends of shield conductors 104, 106 of these terminal coaxial transmission lines are connected to circuit ground 58, and thereby to the microstrip signal-return line. The other ends of the center conductors of the terminal coaxial transmission lines form respective component ports 22 and 24.

A signal voltage may be applied to the center conductor 36 at port 16. The voltage between the signal and signal-return conductors in transmission line 26 then stays the same as the signal is conducted toward the first end of the transmission line, but the voltage on each conductor relative to ground gradually changes. At the first end of the transmission line the voltage relative to circuit ground on the center conductor is ideally ¾ the applied voltage, and the voltage on the first end of the shield conductor is negative and ¼ of the applied voltage, since the two voltages are 180-degrees out of phase, and add up to the applied voltage. Transmission lines 28 and 32 are connected in series across the first end of transmission line 38, from center conductor 36 to ground shield 38. Ideally, the impedances of lines 28 and 32 are equal, so that the input voltage divides equally across them. The same division applies to series lines 30 and 34 at the first ends. Again, half the input voltage appears across each of the series lines at the first end. After traveling to the second end of the line, one half of the input signal then is produced on each of terminals 18, 20, 22, 24 and ideally there is no voltage across impedance 68 at port 66. Conversely, when equal input signals are applied to ports 18 and 20, and equal input signals are applied to ports 22 and 24 that are 180-degrees out of phase with the input signals applied to ports 18 and 20, the sum of the signals is produced on port 16 and any difference in the signals is produced on port 66.

Figure 2:
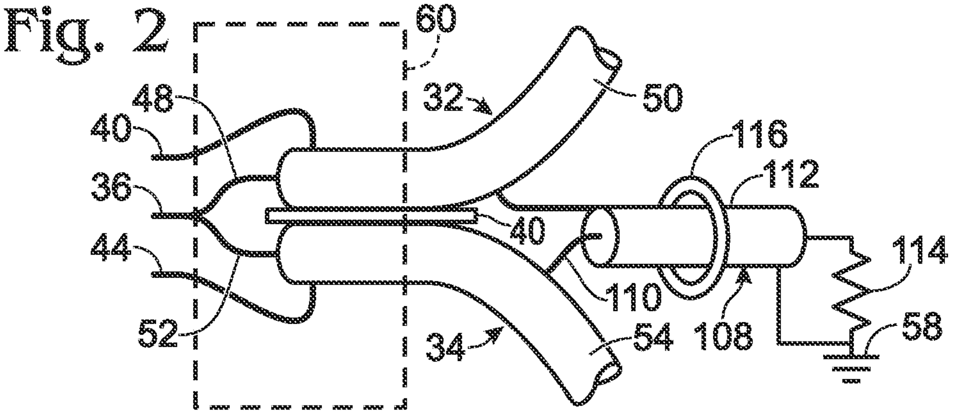
FIG. 2 is a circuit schematic of a second example of a portion of the combiner/divider circuit of FIG. 1.

Referring to FIG. 2, a second example of a termination for transmission line 62 is illustrated. In this example, terminating impedance 68 may be provided by a transmission line 108, shown as a coaxial transmission line with a first end of a center or signal conductor 110 electrically connected to shield conductor 54 and a first end of a shield conductor 112 electrically connected to shield conductor 50. An opposite, second end of center conductor 110 of coaxial transmission line 108 may in turn be terminated by an impedance 114 connected to circuit ground 58. An associated second end of shield conductor 112 may be connected to ground. A ferrite sleeve 116 or an equivalent component may surround part of coax line 108 to prevent currents from flowing on the shield to ground 58.

Figure 3:
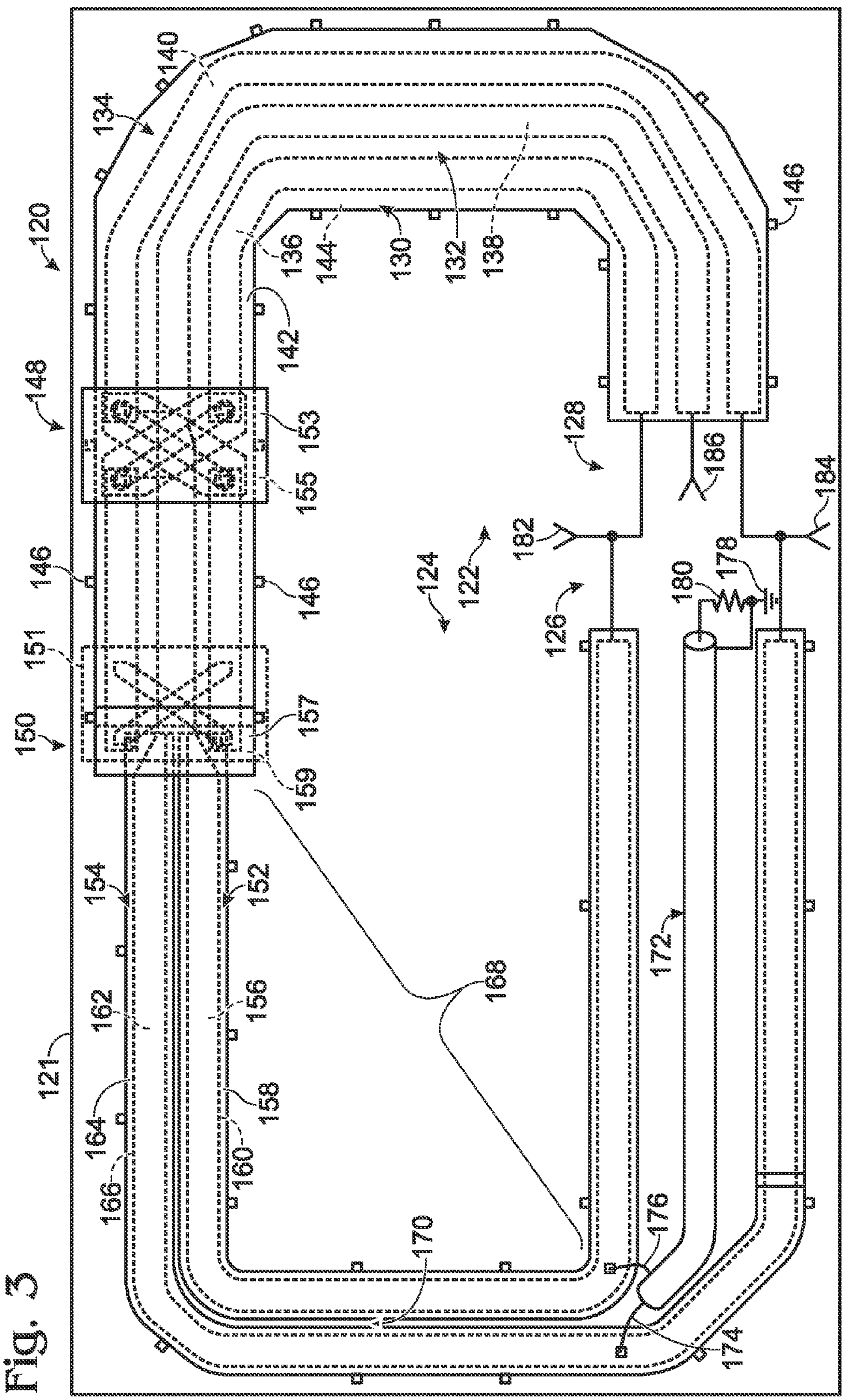
FIG. 3 is a plan view of an example of a substantially planar embodiment of a combiner/divider circuit that may be used in the combiner/divider circuit of FIG. 1.

FIG. 3 illustrates a further embodiment of a combiner/divider circuit 120 in the form of what also may be referred to as a race-track balun. Combiner/divider circuit 120 corresponds to a portion of circuit 10 of FIGS. 1 and 2 associated with transmission lines 26, 28, 30, 32, 34, 62, and 108, and microstrip portions 80B, 80C, 94B, and 94C. The example of combiner/divider circuit 120 includes a plurality of planar transmission lines forming a generally closed "C" shape, although other configurations may also be used. The near-complete loop formed by the planar transmission lines produces a relatively small footprint, with the planar structure described in further detail below providing effective electrical and electromagnetic performance while providing increased thermal conductivity compared to non-planar transmission line embodiments.

In this example, combiner/divider circuit 120 is mounted on a printed circuit board (PCB) 121, and includes a generally J-shaped transmission-line assembly 122, a generally U-shaped transmission-line assembly 124, and a consolidated port region 126 disposed in a gap 128 between opposing ends of the J-shaped and U-shaped assemblies. Transmission-line assembly 122 includes three striplines 130, 132, 134 having respective coplanar signal conductors 136, 138, 140, and shared signal-return conductors 142, 144, separated by dielectric layers 145, not shown in FIG. 3, but shown in subsequent figures. The signal conductors are disposed between the shared signal-return conductors. Signal-return conductor 144 is hidden from view in FIG. 3, but is shown in FIGS. 4-6, 7, and 9. Striplines 130, 132, 134 are analogous to transmission lines 28, 26, 30, respectively, of combiner/divider circuit 10. Conductive columns 146, a few of which are shown with the reference number in FIG. 3, are distributed along the lengths of the outer edges of signal-return conductors 142, 144. These columns provide electrical connection between the two signal-return conductors.

Transmission-line assembly 122 further includes a cross-over or transition region 148 in which signal conductors 136 and 140 transition to opposite sides of signal conductor 138, as will be discussed in further detail with reference to FIGS. 4-6 below. J-shaped transmission-line assembly 122 interconnects with U-shaped transmission-line assembly 124 in a connection region 150 described in further detail with reference to FIGS. 7-9 below.

It will also be appreciated that transition region 148 may be located in different positions along striplines 130, 132, 134. By moving the transition region to the ends of the striplines, it becomes merged into connection region 150 to form what may be considered a combined interconnection region 151 shown in dashed lines. As will become apparent from the following description of the separate transition and connection regions, in this embodiment vias in striplines 130 and 134 share vias used at the ends of those striplines in the connection region.

Figure 9:
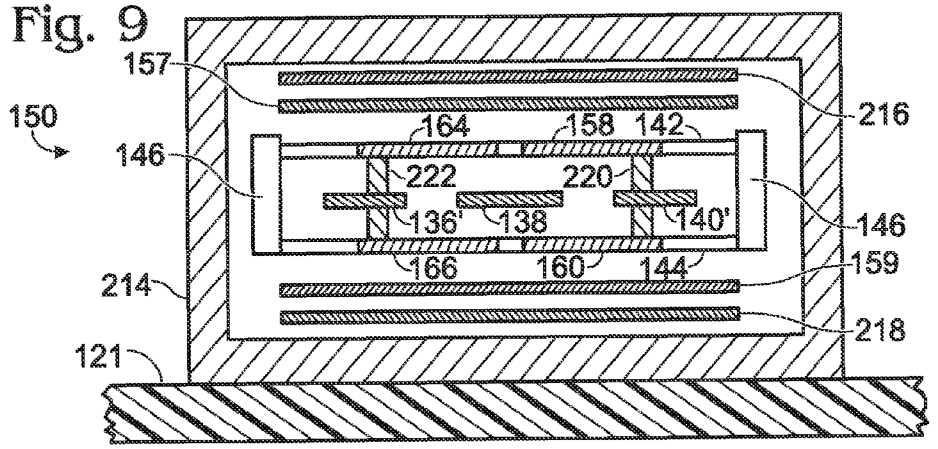
FIG. 9 is a cross-section taken along line 9-9 in FIG. 8.

It is seen that there are signal conductors that are not shielded by signal-return conductors in the transition region and the connection region. In these regions, a conductive plate, such as a copper plate, may be disposed above and below these regions to reduce losses and to provide shielding. For example, plates 153 and 155 may be disposed above and below transition region 148, as is also shown in FIG. 6. Similarly, plates 157 and 159 may be disposed above and below connection region 150, as is also shown in FIG. 9.

Figure 7:
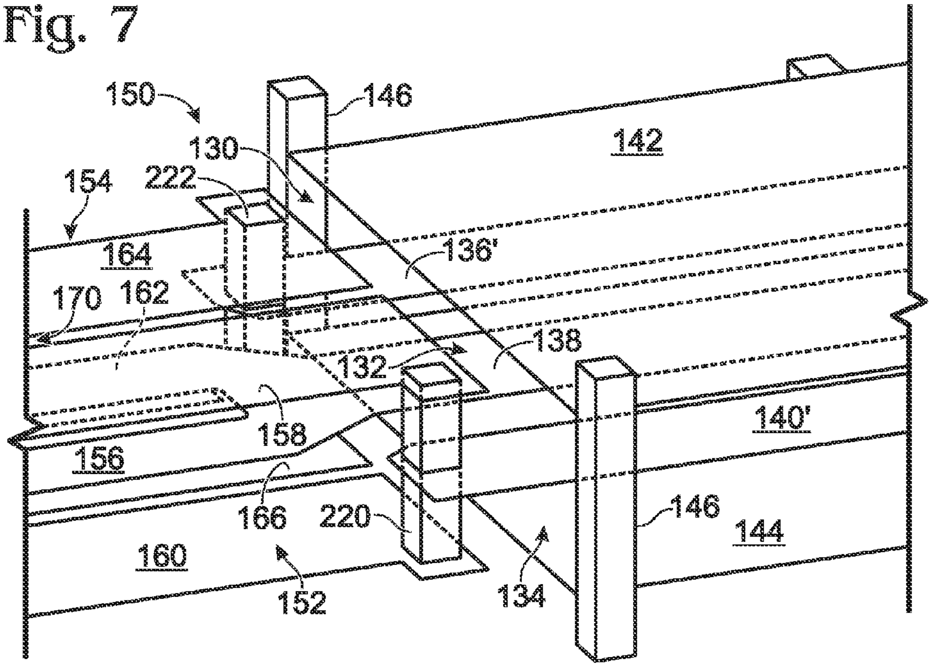
FIG. 7 is an isometric view of a portion of a transmission line connection region of the combiner/divider circuit of FIG. 3.

U-shaped transmission-line assembly 124 includes striplines 152 and 154 analogous to transmission lines 32 and 34 of combiner/divider circuit 10. Stripline 152 includes a signal conductor 156 extending between opposing signal return conductors 158 and 160. Similarly, stripline 154 includes a signal conductor 162 extending between opposing signal return conductors 164 and 166. Signal-return conductors 160 and 166 are hidden from view in FIG. 3, but are shown in FIGS. 7 and 9.

In an L-shaped portion 168 of U-shaped transmission-line assembly 124 adjacent to connection region 150, signal-return conductors 158 and 160 of stripline 152 are each spaced sufficiently close to respective adjacent signal-return conductors 164 and 166 of stripline 154 that they are electromagnetically coupled, forming thereby a transmission line in the form of a slotline 170. Slotline 170 is analogous to transmission line 62 of combiner/divider circuit 10. An end of slotline 170, distal from connection region 150, is terminated by connection to a coaxial transmission line 172. Transmission line 172 includes a center, signal conductor 174 having one end connected to signal return conductor 164 and a shield, signal-return conductor 176 having one end connected to signal return conductor 158. The other end of the shield conductor is connected to a circuit ground 178 and a resistor 180 connects the other end of the center conductor to ground. Transmission line 172 is analogous to transmission line 102 illustrated in FIG. 2.

In port region 126, signal conductors 136 and 156 are connected together to form a first component port 182. Similarly, signal conductors 140 and 162 are connected together to form a second component port 184. Additionally, an end of signal conductor 138 forms a sum port 186.

The striplines have respective planar first and second signal-return conductors disposed on opposite sides of respective signal conductors. The striplines may be referred to generally as transmission lines and may be assigned an ordinal indicator corresponding to the order in which they are introduced. Referring then to striplines 132, 152, 154, 130, and 134 as planar first, second, third, fourth, and fifth transmission lines, it is seen that in the J-shaped transmission-line assembly, first signal-return lines of the first, fourth, and fifth transmission lines are connected along their lengths in the J-shaped, and second signal-return lines of the first, fourth, and fifth transmission lines are connected along their lengths. In the U-shaped transmission-line assembly, the first and second signal-return lines of the second transmission line are spaced from the respective first and second signal-return lines of the third transmission line. Further, the first signal-return conductors of the first, fourth, and fifth planar transmission lines are connected along an electrical length that is greater than one-fourth of the wavelength of a design frequency.

The second and third transmission lines have adjacent respective first signal-return conductors, and a first portion of at least the first signal-return conductors of the second and third transmission lines are tightly coupled and form a sixth transmission line. The sixth transmission line has a first end in the connection region, and has a second end spaced from the connection region that is terminated with an impedance element. A second portion of at least the first signal-return conductors of the second and third transmission lines forming the portion of U-shaped transmission-line assembly beyond the L-shaped portion are loosely coupled and do not form a transmission line.

As shown in FIG. 3, the first, second, third, fourth, and fifth striplines form a continuous loop except for a space, referred to as gap 126, between opposing ends of the first, second, and third striplines and ends of the fourth and fifth striplines spaced from connection region 150. In other words, these transmission lines extend collectively in a C-shape that may nearly form a loop having a gap between ends of the transmission lines opposite the connection ends of the transmission lines in the connection region.

Figure 4:
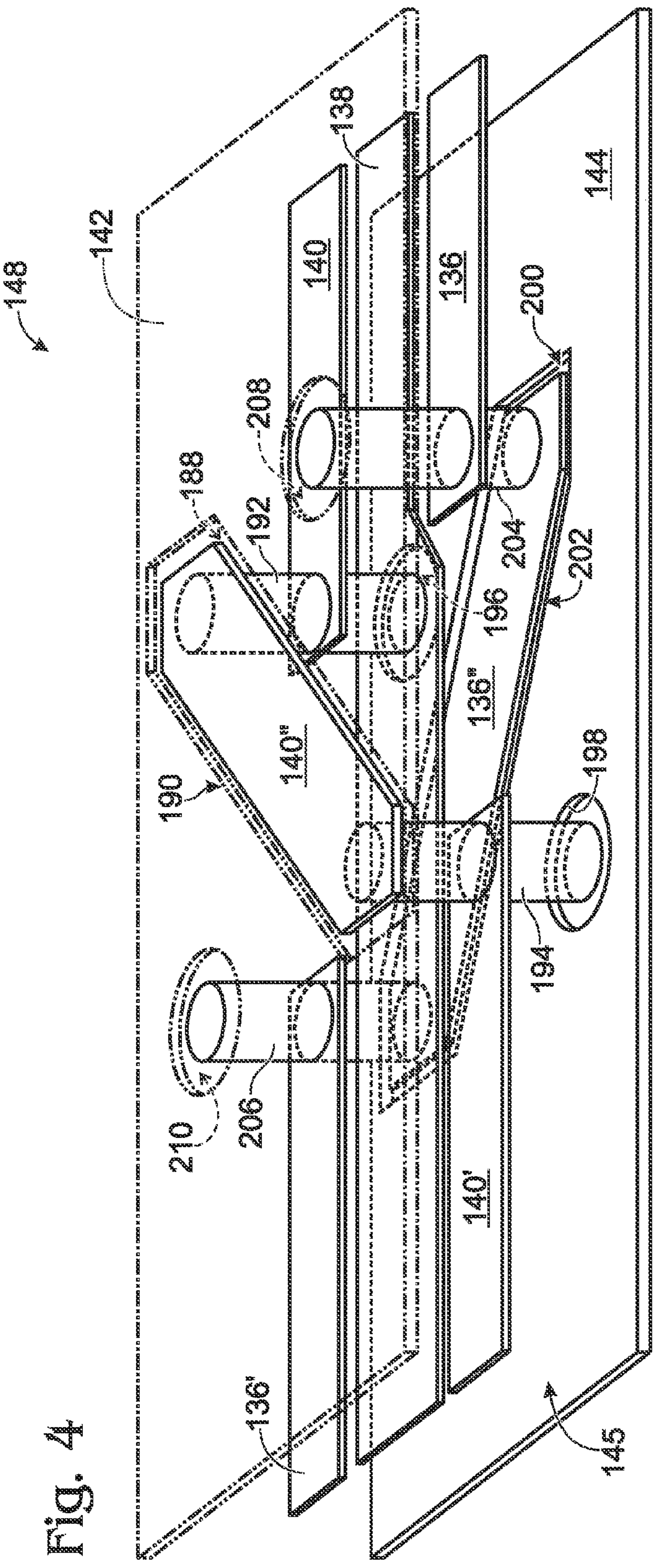
FIG. 4 is an isometric view of a portion of a conductor transition region of the combiner/divider circuit of FIG. 3.
Figure 5:
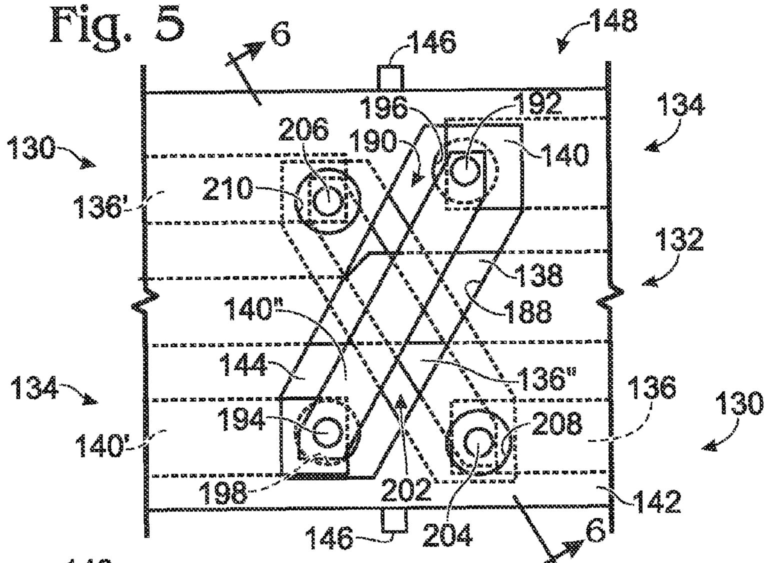
FIG. 5 is a plan view of the transition region of the combiner/divider circuit of FIG. 3.
Figure 6:
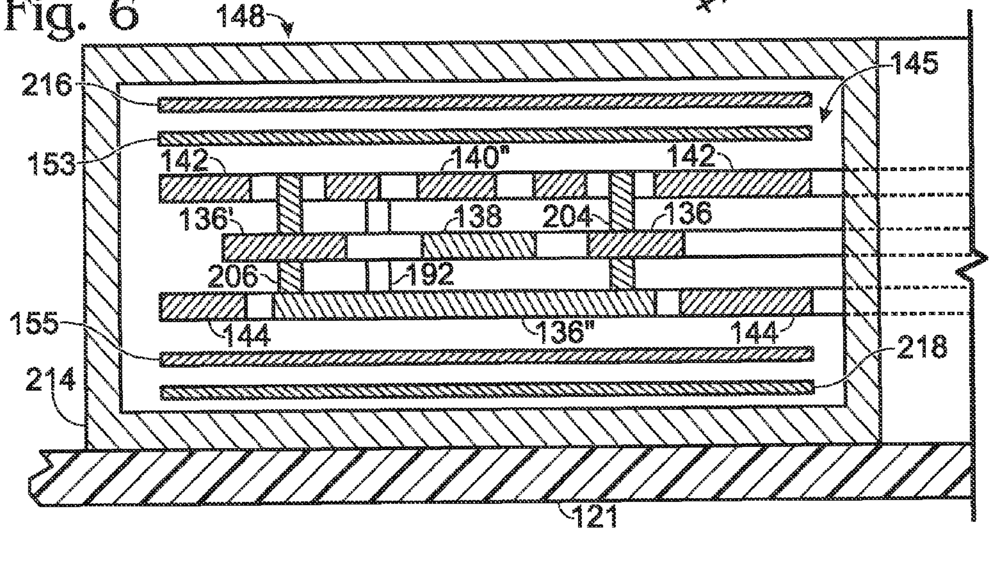
FIG. 6 is a cross-section taken along line 6-6 in FIG. 5.

FIGS. 4-6 illustrate the structure of striplines 130, 132, 134 in transition region 148. FIG. 4 is an isometric view, not to scale, of a portion of the transition region 148, with signal-return conductor 142 shown in dashed lines for clarity of illustration. FIG. 5 is a top view of the transition region of combiner/divider circuit 120. FIG. 6 is a cross-section, not to scale, taken along line 6-6 in FIG. 5.

Signal conductors 136 and 140 end in transition region 148, and center signal conductor 138 extends continuously through the transition region. A new signal conductor 136' having an end spaced from the end of signal conductor 140 extends in line with signal conductor 140 from the transition region to connection region 150. Similarly, a new signal conductor 140' having an end spaced from the end of signal conductor 136 extends in line with signal conductor 136 from the transition region to connection region 150.

An opening 188 extends in upper signal return conductor 142 from the end of signal conductor 140 to the end of signal conductor 140'. A short length of signal conductor 140" coplanar with and spaced from signal return conductor 142 extends from a position over the end of signal conductor 140 to a position over the end of signal conductor 140'. Signal conductor 140" and signal return conductor 142 thus form a short coplanar waveguide 190. The opposite ends of signal conductor 140" are connected to signal conductors 140 and 140' by respective vias 192 and 194. In this example, vias 192 and 194 extend below the plane of signal conductors 140 and 140' to the plane of signal-return conductor 144. In order to electrically isolate the vias from the signal-return conductor, vias 192 and 194 extend into respective openings 196 and 198 in signal-return conductor 144 that are sized larger than the vias, as shown.

Similarly, an opening 200 extends in lower signal return conductor 144 from the end of signal conductor 136 to the end of signal conductor 136'. A short length of signal conductor 136" coplanar with and spaced from signal return conductor 144 extends from a position under the end of signal conductor 136 to a position under the end of signal conductor 136'. Signal conductor 136" and signal return conductor 144 form a short coplanar waveguide 202. The opposite ends of signal conductor 136" are connected to signal conductors 136 and 136' by respective vias 204 and 206. Vias 204 and 206 extend into respective openings 208 and 210 in signal-return conductor 142 that are sized larger than the vias to prevent contact with signal-return conductor 142.

FIGS. 4 and 6 are shown with the vertical dimension expanded for clarity of illustration. Further, FIG. 6 shows in cross section additional structure not shown in the other figures. In particular, FIG. 6 shows combiner/divider circuit 120 mounted on printed circuit board (PCB) 121. Transmission line assemblies 122 and 124 may additionally be contained in a grounded electrically conductive housing 214 that surrounds the transmission line assemblies.

The transmission line assemblies further may be covered with upper and lower ferrite plates 216 and 218 disposed between the housing and the respective upper and lower signal return conductors, such as signal-return conductors 142 and 144 shown in FIG. 6. In a physical embodiment, the various layers shown in the figure may be closely spaced sufficiently that magnetic flux in ferrite plates 216 and 218 readily couple through the space separating them along the outer edges, thereby providing effectively a complete flux path laterally around the transmission line assemblies analogous to conventional ferrite rings. Additionally, conductive plates 153 and 155 may be positioned above and below the transition region between the ferrite plates as is also shown in FIG. 3.

It will be appreciated, then, that combiner/divider circuit 120 includes an example of a planar transmission line structure in which first, second, and third striplines 132, 130, and 134 extend through the transition region, with each stripline including opposing planar first and second signal-return conductors and a planar signal conductor disposed between the first and second signal-return conductors. The first stripline may be disposed between the second and third striplines, the positions of the second and third striplines relative to the first strip line reverses in the transition region.

In other words, the signal conductors of the fourth and fifth transmission lines may be disposed on respective opposite first and second sides of the signal conductor of the first transmission line adjacent to the connection region, and the signal conductors of the fourth and fifth transmission lines may e disposed on respective opposite second and first sides of the signal conductor of the first transmission line spaced from the connection region, the signal conductors of the fourth and fifth transmission lines transitioning between the first and second sides of the signal conductor of the first transmission line in the transition region.

The second stripline may include a first transition signal conductor portion that extends in the transition region from a first side of the signal conductor of the first stripline across the signal conductor of the first stripline to a second side of the signal conductor of the first stripline. The third stripline may include a second transition signal conductor portion that extends in the transition region from the second side of the signal conductor of the first stripline across the signal conductor of the first stripline to the first side of the signal conductor of the first stripline.

Respective planar sections of the first and second transition signal conductor portions may be coplanar with and electrically spaced from the signal-return conductors of the first stripline. The first and second transition signal conductor portions may include respective vias interconnecting the respective planar sections with the respective signal conductors of the second and third striplines extending in opposite first and second directions from the transition region. The first signal-return conductors of the first, second, and third striplines may be connected along their lengths to form a first combined signal-return conductor having a first gap in the transition region; the second signal-return lines of the first, second, and third striplines may be connected along their lengths to form a second combined signal-return conductor having a second gap in the transition region; and the first and second transition signal conductor portions may extend along the respective first and second gaps. Thus, the signal conductor of the fourth transmission line includes a transition portion in the transition region that is coplanar with the first signal-return conductor of the first transmission line.

Figure 8:
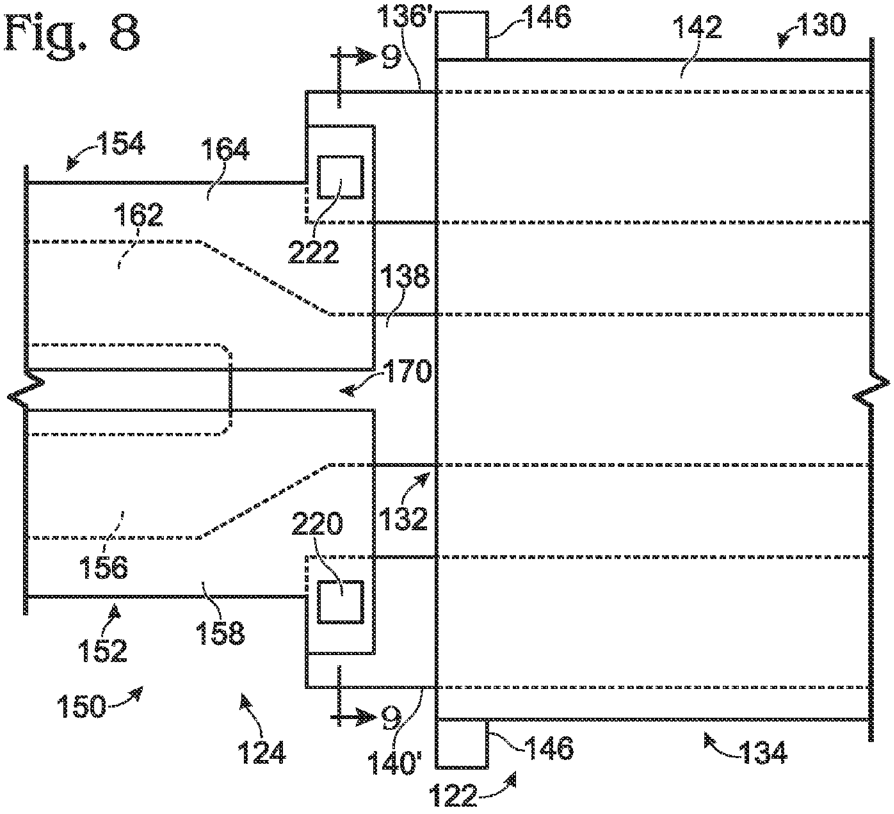
FIG. 8 is an enlargement of the connection region of the combiner/divider circuit of FIG. 3.

As mentioned above, J-shaped transmission-line assembly 122 interconnects with U-shaped transmission-line assembly 124 in a connection region 150 illustrated in FIGS. 7-9. FIG. 7 is an isometric view, not to scale, of connection region 150. FIG. 8 is a plan view of the connection region. FIG. 9 is a cross-section, not to scale, taken along line 9-9 in FIG. 8.

In connection region 150, striplines 130, 132, and 134 of J-shaped transmission-line assembly 122 interconnect with striplines 152 and 154 of U-shaped transmission-line assembly 124. More specifically, signal conductors 136' and 140', and signal-return conductors 142, 144, 158, 160, 162, and 164 terminate at respective connection ends in the connection region. A connection end of signal conductor 138 of stripline 132 bifurcates into, and thereby interconnects with, the connection ends of two conductors forming signal conductors 156 and 162 of striplines 152 and 154. In this example, signal conductors 138, 156, and 162 are coplanar, signal-return conductors 142, 158, and 164 are coplanar, and signal-return conductors 144, 160, and 166 are coplanar. A via 220 extends between the ends of signal-return conductors 158 and 160 and through the end of signal conductor 140', thereby interconnecting signal conductor 140' with signal-return conductors 158 and 160. Similarly, a via 222 extends between the ends of signal-return conductors 164 and 166 and through the end of signal conductor 136', thereby interconnecting signal conductor 136' with signal-return conductors 164 and 166. This structure is analogous to the interconnection of transmission lines 12, 28, 30 with transmission lines 32 and 34 of combiner/divider circuit 10.

As shown in FIG. 9, transmission line assemblies 122 and 124 and connection region 150 (or interconnection region 151) may be contained in grounded electrically conductive housing 214 that surrounds the transmission line assemblies. The connection region further may be covered with upper and lower ferrite plates 216 and 218 disposed between the housing and the respective upper and lower signal return conductors, such as upper signal-return conductors 142,158, 164, and lower signal-return conductors 144, 160, 166. Additionally, conductive plates 157 and 159 may be positioned above and below the connection region between the ferrite plates as is also shown in FIG. 3.

It will be appreciated, then, that combiner/divider circuit 120 may include a plurality of planar transmission lines. Each transmission line may have a planar signal conductor and at least a planar first signal-return conductor disposed in spaced opposition to the respective signal conductor of the same transmission line. The first signal-return conductors of the plurality of planar transmission lines may also be coplanar in a connection region. A connection end of the signal conductor of the first transmission line may be connected to connection ends of the signal conductors of second and third transmission lines.

A first via may connect a connection end of the first signal-return conductor of the fourth transmission line with a connection end of the first signal conductor of the second transmission line. A second via may connect a connection end of the first signal-return conductor of the fifth transmission line with a connection end of the first signal conductor of the second transmission line. The first and second vias may also be connected to the respective second signal-return lines of the second and third transmission lines.

Each of the signal-return conductors of the first, fourth, and fifth transmission lines may be electrically spaced from each of the signal-return conductors of the second and third transmission lines in the connection region. The first, second, third, fourth, and fifth striplines may be interconnected in the connection region, which is spaced from the transition region to form a combiner/divider circuit.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of combiner/divider circuits have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure.

An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

INDUSTRIAL APPLICABILITY

The methods and apparatus described in the present disclosure are applicable to radio frequency communications, radar, and other industries in which combiner/divider devices and baluns are used.

The invention claimed is:

1. A combiner/divider circuit comprising:

first, second, third, fourth, and fifth planar transmission lines, each of the first, second, third, fourth, and fifth transmission lines having a planar signal conductor and a planar first signal-return conductor disposed in spaced opposition to the signal conductor, the signal and signal-return conductors of the first, second, third, fourth, and fifth transmission lines having connection ends in a connection region, and the connection end of the signal conductor of the first transmission line being connected to the connection ends of the signal conductors of second and third transmission lines;

a first via connecting the connection end of the signal conductor of the fourth transmission line with the connection end of the first signal-return conductor of the second transmission line; and a second via connecting the connection end of the signal conductor of the fifth transmission line with the connection end of the first signal-return conductor of the third transmission line.

2. The combiner/divider circuit of claim 1, wherein the planar first, second, third, fourth, and fifth transmission lines extend collectively in a C-shape having a gap between ends of the transmission lines opposite the connection ends of the transmission lines.

3. The combiner/divider circuit of claim 1, wherein the planar first, second, third, fourth, and fifth transmission lines are each strip lines, and also have respective planar second signal-return conductors disposed on an opposite side of the respective signal conductors from the planar first signal-return conductors.

4. The combiner/divider circuit of claim 3, wherein the first signal-return lines of the first, fourth, and fifth transmission lines are connected along their lengths, the second signal-return lines of the first, fourth, and fifth transmission lines are connected along their lengths, and the first and second signal-return lines of the second transmission line are spaced from the respective first and second signal-return lines of the third transmission line.

5. The combiner/divider circuit of claim 3, wherein the second and third transmission lines have adjacent respective first signal-return conductors, and a first portion of at least the first signal-return conductors of the second and third transmission lines are tightly coupled and form a sixth transmission line.

6. The combiner/divider circuit of claim 5, wherein the sixth transmission line has a first end in the connection region.

7. The combiner/divider circuit of claim 6, wherein the sixth transmission line has a second end spaced from the connection region that is terminated with an impedance element.

8. The combiner/divider circuit of claim 6, wherein a second portion of at least the first signal-return conductors of the second and third transmission lines are loosely coupled and do not form a transmission line.

9. The combiner/divider circuit of claim 3, wherein the first and second vias are also connected to the respective second signal-return lines of the second and third transmission lines.

10. The combiner/divider circuit of claim 1, wherein the first signal-return conductors of the first, fourth, and fifth planar transmission lines are connected along an electrical length that is greater than one-fourth of a wavelength of a design frequency.

11. The combiner/divider circuit of claim 1, wherein each of the signal-return conductors of the first, fourth, and fifth transmission lines is electrically spaced from each of the signal-return conductors of the second and third transmission lines in the connection region.

12. The combiner/divider circuit of claim 1, wherein the signal conductors of the fourth and fifth transmission lines are disposed on respective opposite first and second sides of the signal conductor of the first transmission line adjacent to the connection region, and the signal conductors of the fourth and fifth transmission lines are disposed on the respective opposite second and first sides of the signal conductor of the first transmission line spaced from the connection region, the signal conductors of the fourth and fifth transmission lines transitioning between the first and second sides of the signal conductor of the first transmission line in a transition region.

13. The combiner/divider circuit of claim 12, wherein the signal conductor of the fourth transmission line includes a transition portion in the transition region that is coplanar with the first signal-return conductor of the first transmission line.

14. A planar transmission line structure comprising:

first, second, and third striplines extending through a transition region, each of the striplines including opposing planar first and second signal-return conductors and a planar signal conductor disposed between the first and second signal-return conductors, the first stripline being disposed between the second and third striplines, and positions of the second and third striplines relative to the first strip line reversing in the transition region;

the second stripline including a first transition signal conductor portion that extends in the transition region from the signal conductor of the second stripline on a first side of the signal conductor of the first stripline in a first direction from the transition region to the signal conductor of the second stripline on a second side of the signal conductor of the first stripline in a second direction from the transition region;

the third stripline including a second transition signal conductor portion that extends in the transition region from the signal conductor of the third stripline on the second side of the signal conductor of the first stripline in the first direction from the transition region to the signal conductor of the third stripline on the first side of the signal conductor of the first stripline in the second direction from the transition region; and the first and second transition signal conductor portions extending in spaced relationship from the first signal conductor.

15. The planar transmission line structure of claim 14, wherein respective planar sections of the first and second transition signal conductor portions are coplanar with and electrically spaced from the signal-return conductors of the first stripline.

16. The planar transmission line structure of claim 15, wherein the first and second transition signal conductor portions include respective vias interconnecting the respective planar sections with the respective signal conductors of the second and third striplines extending in opposite first and second directions from the transition region.

17. The planar transmission line structure of claim 14, wherein the first signal-return conductors of the first, second, and third striplines are connected along their lengths forming a first combined signal-return conductor having a first gap in the transition region, the second signal-return lines of the first, second, and third striplines are connected along their lengths forming a second combined signal-return conductor having a second gap in the transition region, and the first and second transition signal conductor portions extend along the respective first and second gaps.

18. The planar transmission line structure of claim 14, wherein the first and second combined signal-return conductors extend along the associated signal conductors of the first, second, and third striplines an electrical length that is greater than one-fourth of a wavelength of a design frequency.

19. The planar transmission line structure of claim 14, further comprising fourth and fifth striplines each having a planar signal conductor disposed between two planar signal-return conductors, the first, second, third, fourth, and fifth striplines being interconnected in a connection region spaced from the transition region to form a combiner/divider circuit.

20. The planar transmission line structure of claim 19, wherein the first, second, third, fourth, and fifth striplines form a continuous loop except for a space between opposing ends of the first, second, and third striplines and ends of the fourth and fifth striplines spaced from the connection region.

* * * * *